United States Patent [19]

Pelletier

[11] 4,399,402
[45] Aug. 16, 1983

[54] RESISTIVE FAULT SECTIONALIZATION

[75] Inventor: James A. Pelletier, Dover, N.J.

[73] Assignee: Bell Telephone Laboratories, Incorporated, Murray Hill, N.J.

[21] Appl. No.: 298,074

[22] Filed: Aug. 31, 1981

[51] Int. Cl.$^3$ .................. G01R 31/08; H04B 3/46
[52] U.S. Cl. .................. 324/52; 179/175.3 R; 179/175.3 F
[58] Field of Search .................. 324/51, 52; 179/175.3 R, 175.3 F

[56] References Cited

U.S. PATENT DOCUMENTS 3,234,459  2/1966  Brazee .................. 324/52
3,248,646  4/1966  Brazee .................. 324/52

OTHER PUBLICATIONS

Maloney, "Locating Cable Faults"-*IEEE Trans. on Industry Appls.* vol. IA-9, No. 4, Jul./Aug. 1973-pp. 380-394.

*Primary Examiner*—Stanley T. Krawczewicz
*Assistant Examiner*—Jose M. Solis
*Attorney, Agent, or Firm*—R. O. Nimtz

[57] ABSTRACT

A methodology, and associated circuitry, for locating a resistive shunt fault coupling the cable shield and the conductors of the cable pair under test comprises the steps of: (i) measuring the open-circuited DC resistance ($A_1$ and $A_2$) of the pair from test locations (A and B) which straddle the fault; (ii) measuring the short-circuited DC resistance ($A_3$) of the pair from one of the test points (A or B); and (iii) evaluating the resistance of one conductor of the pair between the fault and the location of the short circuit measurement according to a predetermined quadratic expression involving the three measured quantities. Sensitivity of the measurement technique is reduced by adding a resistor in series with said pair, at either location A or B, so that $A_2$ is substantially equal to $A_1$.

7 Claims, 4 Drawing Figures

RESISTIVE FAULT SECTIONALIZATION

BACKGROUND OF THE INVENTION

1. Field of the Invention

This invention relates generally to detecting faults in multipair cable and, more particularly, to circuitry and associated methodology for locating two-sided resistive shunt faults coupling a cable pair with the cable shield.

2. Description of the Prior Art

In the subscriber loop portion of telecommunications systems, shielded, multipair cable is the predominant medium utilized for signal transmission. The cable generally comprises many individual insulated conductors twisted together into pairs; the pairs are contained within a single protective sheath which includes a continuous metallic shield. Typically, each pair connects a customer premises to a switching point, usually a central office, or numerous pairs connect switching points.

During the course of usage of the cable, pairs may be rendered defective in a number of ways. A conductor may be inadvertently broken or a conductor pair may be shorted or have a low resistance path created between the pairs. These types of faults preclude using the pair because of the service-affecting nature of the fault. Fortunately, however, these faults may be readily detected and located relative to a single test position by suitable resistance or capacitance measuring devices long available in the art.

Particularly troublesome, though, are single-sided (either the tip or ring of a pair is faulted at a point) or two-sided (both tip and ring are faulted at the same point) faults having a high resistance coupling the pair and/or the shield. Such leakage paths may be caused, for example, by water contamination of the cable core via a defective sheath. These faults have proven difficult to localize because they cause only a minor perturbation on the characteristics of the transmission medium and the faults may be masked by other irregularities during testing.

Resistive, shunt-type faults of a service degrading nature may be partitioned into four basic categories, namely: Case 1—single-sided, with the resistance linking the tip conductor and shield or ring conductor and shield being less than one megohm; Case 2—double-sided, shunt only wherein a resistance of less than one megohm links the tip and the ring conductors; Case 3—double-sided involving either the shunt and ring-shield paths or the shunt and the tip-shield paths with linking resistances of less than one megohm; and Case 4—double-sided wherein (i) three resistances of less than one megohm each couple the tip-ring, ring-shield and tip-shield paths or (ii) two resistances of less than one megohm couple the ring-shield and tip-shield paths, respectively. It has been estimated that approximately 95% of all resistive faults fall equally into cases 1, 2 and 4 with the remainder falling into case 3.

Locating faults of the type covered by cases 1, 2 or 3 is accomplished via bridge-type measurements which are well-known in the art. The article entitled "Locating Cable Faults," by C. A. Maloney, *IEEE Transactions on Industry Applications*, July/August 1973, particularly pages 385 and 386, is representative of bridge-type techniques, and conventional variations thereon, employed to estimate the electrical distance to the fault. With a bridge technique, the faulted conductor is connected so that at least one conductor section, on either side of the fault, becomes a leg of the bridge. The fault is generally placed in series with the bridge supply voltage. Another conductor (or conductors) is (are) required to connect the faulted conductor back to the instrumentation of the bridge and, oftentimes, for accurate measurements, the good wire(s) must be the same length and gauge as the faulted wire.

When using a bridge, as alluded to above, the strategy is to select an interconnection arrangement using the faulted pair, and shield when necessary, so that one section of the faulted conductor may be isolated as a leg of the bridge. With case 4, such an arrangement is not feasible because no set of strappings can isolate a desired unknown. Although the availability of another good wire or pair would alleviate this difficulty, bridge-type measurements are precluded in the common-place situation wherein all other pairs in the cable are working pairs.

SUMMARY OF THE INVENTION

The prior art shortcomings, deficiencies and limitations are obviated, in accordance with the present invention, by cable testing circuitry, and associated methods, that locate high resistance, double-sided faults utilizing only the faulted pair.

Broadly speaking, the methodology requires that three sets of independent measurements be made on the faulted pair. In the preferred embodiment, these measurements are made from test positions, designated points A and B, which straddle the fault. The first measurement provides the DC resistance between the tip and ring, say at point A, with the pair open at point B. The second measurement reverses the arrangement in that the DC resistance of the pair is measured at point B with the pair open at point A. Finally, the third measurement provides the DC resistance of the pair at point B with the pair shorted at point A. The DC resistance from point B to the fault results from the realizable solution to a quadratic expression involving the three measurements.

The organization and operation of this invention will be better understood from a consideration of the detailed description of illustrative embodiments thereof, which follows, when taken in conjunction with the accompanying drawing.

DETAILED DESCRIPTION

Figure 1:
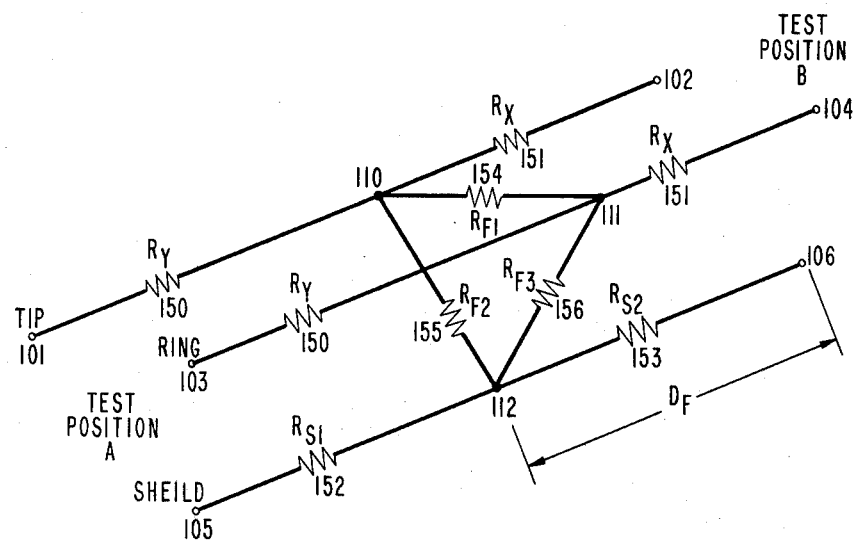
FIG. 1 is a general representation of a double-sided fault having resistances that couple the tip-ring, tip-shield and ring-shield circuit paths at a fault point along the span of the cable pair under test.

A three-wire transmission line, comprising TIP wire with terminal nodes 101 and 102, RING wire with nodes 103 and 104 and SHIELD wire with nodes 105 and 106, is shown in FIG. 1 along with fault resistances $R_{F1}$ (resistor 154), $R_{F2}$ (resistor 155) and $R_{F3}$ (resistor 156) coupling, respectively, the TIP-RING wires at nodes 110 and 111, the TIP-SHIELD wires at nodes and 110 and 112 and the RING-SHIELD wires at nodes 111 and 112. Nodes 101, 103 and 105 appear at the same location along the faulted pair and this location is designated TEST POSITION A. Similarly, nodes 102, 104 and 106 appear at TEST POSITION B. Nodes 110, 111 and 112 all appear at an unknown distance, shown as $D_F$, from TEST POSITION B. The DC resistance $R_Y$ of each faulted wire between TEST POSITION A and the fault location is represented by resistor 150. In addition, the DC resistance $R_X$ between the fault location and TEST POSITION B is represented by resistor 151. Both $R_X$ and $R_Y$ are unknown prior to fault location measurements. Once $R_X$ (or $R_Y$) is determined from the measurements, and presuming the gauge of the faulted pair is known, the electrical distance $D_F$ may be estimated.

The DC resistances $R_{S1}$ and $R_{S2}$ of the shield between TEST LOCATIONS A and B and the point of the fault are represented, respectively, by resistors 152 and 153, and are shown for completeness since their values do not enter into the measurements.

The general representation of the faulted pair depicted in FIG. 1 actually covers such subcases (i) and (ii) set forth above under case 4. For instance, if resistance $R_{F1}$ is greater than one megohm so that the TIP-RING path is no longer considered to exhibit a fault, the second subcase (ii) is obtained. Thus, both the subcases of interest may be treated by analyzing the network of FIG. 1.

Figure 2:
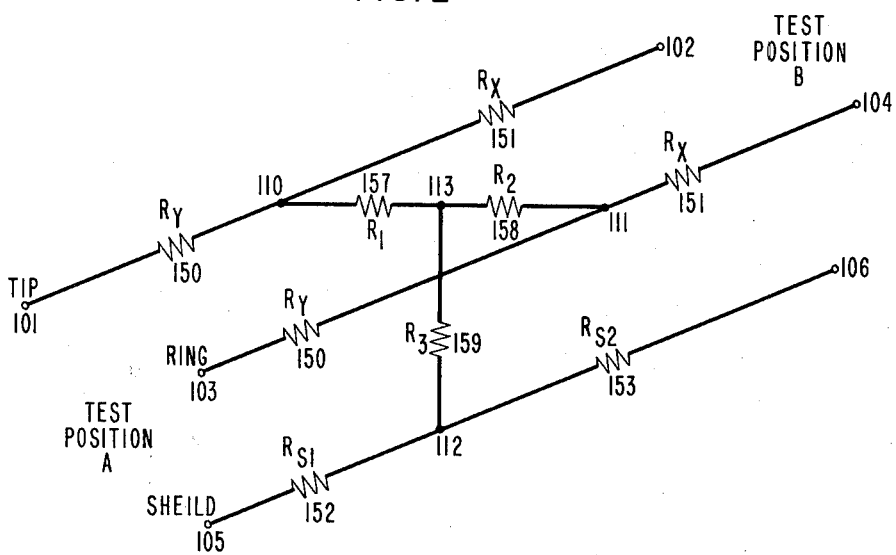
FIG. 2 is the representation of the network of FIG. 1 after a delta-wye transform is performed on the fault resistance network.
Figure 3:
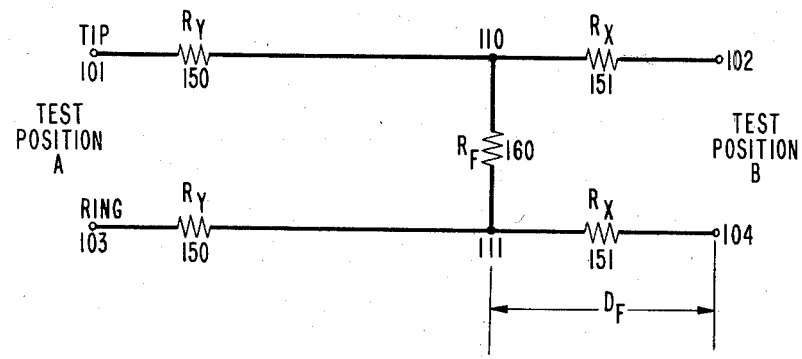
FIG. 3 depicts an equivalent circuit representation for the networks of FIGS. 1 and 2 for measurements treating only the metallic propagation mode of the pair under test.

To place the network of FIG. 1 in a form more amenable to analysis, a delta-to-wye transform is performed on the fault network to yield the representation of the faulted pair shown in FIG. 2. Since the measurement regime of the present invention utilizes only the metallic propagation mode, that is the TIP-RING conductor paths, the transformed circuit of FIG. 2 may be reduced to that shown in FIG. 3, where $R_F = R_1 + R_2$. Since there are basically three unknowns ($R_X$, $R_Y$, and $R_F$), three independent measurements are necessary to solve for the unknowns.

The three measurements selected for illustrating one embodiment of the present invention are obtained as follows:

(1) at TEST POSITION A, the DC resistance, designated $A_1$, of the pair between nodes 101 and 103 is measured with the pair open-circuited at TEST POSITION B, which yields $A_1 = 2R_Y + R_F$;

(2) at TEST POSITION B, the DC resistance, designated $A_2$, of the pair between nodes 102 and 104 is measured with the pair open-circuited at TEST POSITION A, which yields $A_2 = 2R_X + R_F$; and (3) at TEST POSITION B, the DC resistance, designated $A_3$, of the pair between nodes 102 and 104 is measured with the pair short-circuited between nodes 101 and 103 at TEST POSITION A, thereby yielding $A_3 = 2R_X + 2R_F R_Y / (R_F + 2R_Y)$.

Solving for $R_X$ in terms of $A_1$, $A_2$ and $A_3$ yields the quadratic expression $$R_X{}^2 - A_2 R_X + (A_1/4)(A_3 - A_2) + (A_2/2)^2 = 0. \quad (1)$$

Typically there is only one realistic solution to quadratic expression (1) and the electrical distance to the fault is estimated from this solution.

Figure 4:
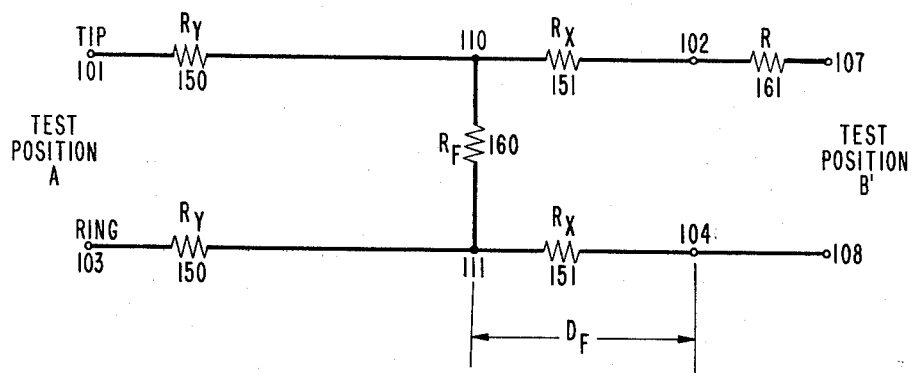
FIG. 4 depicts a resistor added to the network of FIG. 3 for decreasing the sensitivity of the measurements to errors caused by instrumentation inaccuracies.

Under certain conditions, some simplification to equation (1) is possible. For example, if it is determined that $A_1$ is greater than $A_2$, implying that $R_Y > R_X$, then a resistance R may be added in series with the faulted pair at TEST POSITION B. This is depicted in FIG. 4, where resistance R is represented by resistor 161. Nodes 107 and 108 define a new test location, labeled TEST LOCATION B', which is physically located with TEST POSITION B but is electrically displaced from that position. Also, as is the usual case, if it is determined that $A'_2 = A_2 + R \gg A_3$, that is, the fault resistance $R_F$ is large compared to $R_Y$, then the realizable solution to equation (1) yields the approximation $$R_X = A_3/4. \quad (2)$$

The configuration suggested above and depicted by FIG. 4 is quite useful for another reason as well. It can be demonstrated that errors caused by instrumentation inaccuracies can be minimized when $A_1$ equals $A_2$. Resistance R is used to induce this equality and thereby reduce the measurement sensitivity. The electrical distance equivalent of resistance R is then subtracted from $R_X$ in order to obtain the appropriate estimate to distance $D_F$.

It is to be further understood that the cable pair testing arrangements, and associated methodology, described herein is not limited to the specific forms by way of example and illustration, but may assume other embodiments limited only by the scope of the appended claims.

What is claimed is:

1. A method for testing a cable pair (TIP,RING) to locate a shunt resistance fault ($R_F$) between first (A) and second (B) test positions by determining the conductor (TIP or RING) resistance ($R_X$) between said fault and said second test position, said method

CHARACTERIZED BY THE STEPS OF measuring the DC resistance ($A_1$) of said pair at said first test position with said pair open-circuited at said second test position, measuring the DC resistance ($A_2$) of said pair at said second test position with said pair open-circuited at said first test position, measuring the DC resistance ($A_3$) of said pair at said second test position with said pair short-circuited at said first test position, and determining the value of said resistance ($R_X$) from the expression $$R_X{}^2 - A_2 R_X + (A_1/4)(A_3 - A_2) + (A_2/2)^2 = 0.$$

2. A method for testing a cable pair (TIP,RING) to locate a shunt resistance fault ($R_F$) between first (A) and second (B) test positions by determining the conductor (TIP or RING) resistance ($R_X$) between said fault and said second test position, said method

CHARACTERIZED BY THE STEPS OF measuring the DC resistance ($A_1$) of said pair at said first test position with said pair open-circuited at said second test position, adding a preselected resistance ($\pm R$) in series with one conductor (TIP or RING) of said pair to form a series combination, measuring the DC resistance ($A_2$) of said series combination at said second test position with said pair open-circuited at said first test position, measuring the DC resistance ($A_3$) of said series combination at said second test position with said pair short-circuited at said first test position, and determining the value of said resistance ($R_X$) from the expression $$(R_X \pm R)^2 - A_2(R_X \pm R) + (A_1/4)(A_3 - A_2) + (A_2/2)^2 = 0.$$

3. The method as recited in claim 2 further comprising the step of selecting said resistance ($\pm R$) so that $A_2$ essentially equals $A_1$.

4. Testing apparatus for locating a pair fault ($R_F$) between first (A) and second (B) test positions by determining the conductor (TIP or RING) resistance ($R_X$) between said fault and said second test location, said apparatus

CHARACTERIZED BY first means at said first location to sequentially configure said pair (i) for measuring the DC resistance ($A_1$), (ii) by open-circuiting and (iii) by short-circuiting said pair, respectively, and second means at said second location, operating simultaneously with said first means, to configure said pair (i) by open-circuiting said pair, (ii) for measuring the DC resistance ($A_2$), and (iii) for measuring the DC resistance ($A_3$), respectively, of said pair, wherein said resistance ($R_X$) is a solution to the quadratic expression
$$R_X^2 - A_2 R_X + (A_1/4)(A_3 - A_2) + (A_2/2)^2 = 0.$$

5. Testing apparatus for locating a pair fault ($R_F$) between first (A) and second (B) test locations by determining the conductor (TIP or RING) resistance ($R_X$) between said fault and said second test location, said apparatus

CHARACTERIZED BY first means at said first location to sequentially configure said pair (i) for measuring the DC resistance ($A_1$), by (ii) open-circuiting and (iii) by short-circuiting said pair, respectively, and second means at said second location, operating simultaneously with said first means, to configure said pair (i) by open-circuiting said pair, (ii) by adding a preselected resistor ($\pm R$) in series with one conductor of said pair and measuring the DC resistance ($A_2$) of the series combination, and (iii) by measuring the DC resistance ($A_3$) of said combination, wherein said resistance ($R_X$) is a solution to the quadratic expression $$(R_X \pm R)^2 - A_2(R_X \pm R) + (A_1/4)(A_3 - A_2) + (A_2/2)^2 = 0.$$

6. The apparatus as recited in claim 5 wherein said resistor ($\pm R$) is chosen so that $A_2$ essentially equals $A_1$.

7. Wire-pair apparatus for testing a resistive fault ($R_F$) located between first (A) and second (B) test locations and for determining the resistance ($R_X$) of one wire (TIP or RING) between said fault and said second test location, said apparatus

CHARACTERIZED BY first means at said first location having three sequential modes of operation including: a first mode for measuring the DC resistance ($A_1$) of said pair; a second mode for disconnecting said first means from said pair; and a third mode for shorting said pair, and second means at said second location operating in one-to-one correspondence to said modes for: disconnecting said second means from said pair during said first mode; measuring the DC resistance ($A_2$) of said pair during said second mode; and measuring the DC resistance ($A_3$) of said pair during said third mode, wherein said resistance ($R_X$) is a solution to the quadratic expression $$R_X^2 - A_2 R_X + (A_1/4)(A_3 - A_2) + (A_2/2)^2 = 0.$$

* * * * *